United States Patent
Fan et al.

(10) Patent No.: US 7,501,869 B2
(45) Date of Patent: Mar. 10, 2009

(54) LOW POWER, LOW PHASE JITTER, AND DUTY CYCLE ERROR INSENSITIVE CLOCK RECEIVER ARCHITECTURE AND CIRCUITS FOR SOURCE SYNCHRONOUS DIGITAL DATA COMMUNICATION

(75) Inventors: Yongping Fan, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 11/592,594

(22) Filed: Nov. 3, 2006

(65) Prior Publication Data

US 2008/0122507 A1    May 29, 2008

(51) Int. Cl.
*H03L 7/06* (2006.01)
(52) U.S. Cl. ....................... 327/158; 327/161
(58) Field of Classification Search ................ 327/158, 327/161
See application file for complete search history.

(56) References Cited

U.S. PATENT DOCUMENTS

| | | | | |
|---|---|---|---|---|
| 6,650,157 B2 * | 11/2003 | Amick et al. | | 327/158 |
| 6,844,761 B2 * | 1/2005 | Byun et al. | | 327/158 |
| 6,956,418 B2 * | 10/2005 | Kwak et al. | | 327/158 |
| 6,958,634 B2 * | 10/2005 | Rashid | | 327/141 |
| 2003/0062936 A1 * | 4/2003 | Kennedy et al. | | 327/158 |
| 2006/0274874 A1 * | 12/2006 | Kumar et al. | | 375/362 |

* cited by examiner

*Primary Examiner*—Kenneth B Wells
*Assistant Examiner*—John W Poos
(74) *Attorney, Agent, or Firm*—Seth Z. Kalson (57) ABSTRACT

A clock receiver architecture for source synchronous digital data communication, the receiver including a forwarded clock amplifier to provide the received forwarded clock signal to a plurality of delay locked loops. Each delay locked loops provides to one or more phase interpolators a set of clock signals generated from the received forwarded clock, where the relative phases of the set of clock signals are uniformly spaced. Phase interpolators interpolate between two adjacent (with respect to phase) clock signals so as to provide a clock signal to sample received data at the center of the data eye. In some embodiments, an on-die voltage regulator provides a regulated supply voltage to the delay locked loops and phase interpolators. In some embodiments, pull-up currents and pull-down currents in the phase locked loops and phase interpolators are matched across process, supply voltage, and temperature variations so that the relative phases of the clock signals are insensitive across process, supply voltage, and temperature variations. Other embodiments are described and claimed.

5 Claims, 8 Drawing Sheets

LOW POWER, LOW PHASE JITTER, AND DUTY CYCLE ERROR INSENSITIVE CLOCK RECEIVER ARCHITECTURE AND CIRCUITS FOR SOURCE SYNCHRONOUS DIGITAL DATA COMMUNICATION

FIELD

Embodiments of the present invention relate to electronic circuits, and more particularly, to clock receiver architectures for source synchronous digital data communication with low power and low phase jitter.

BACKGROUND

Figure 1:
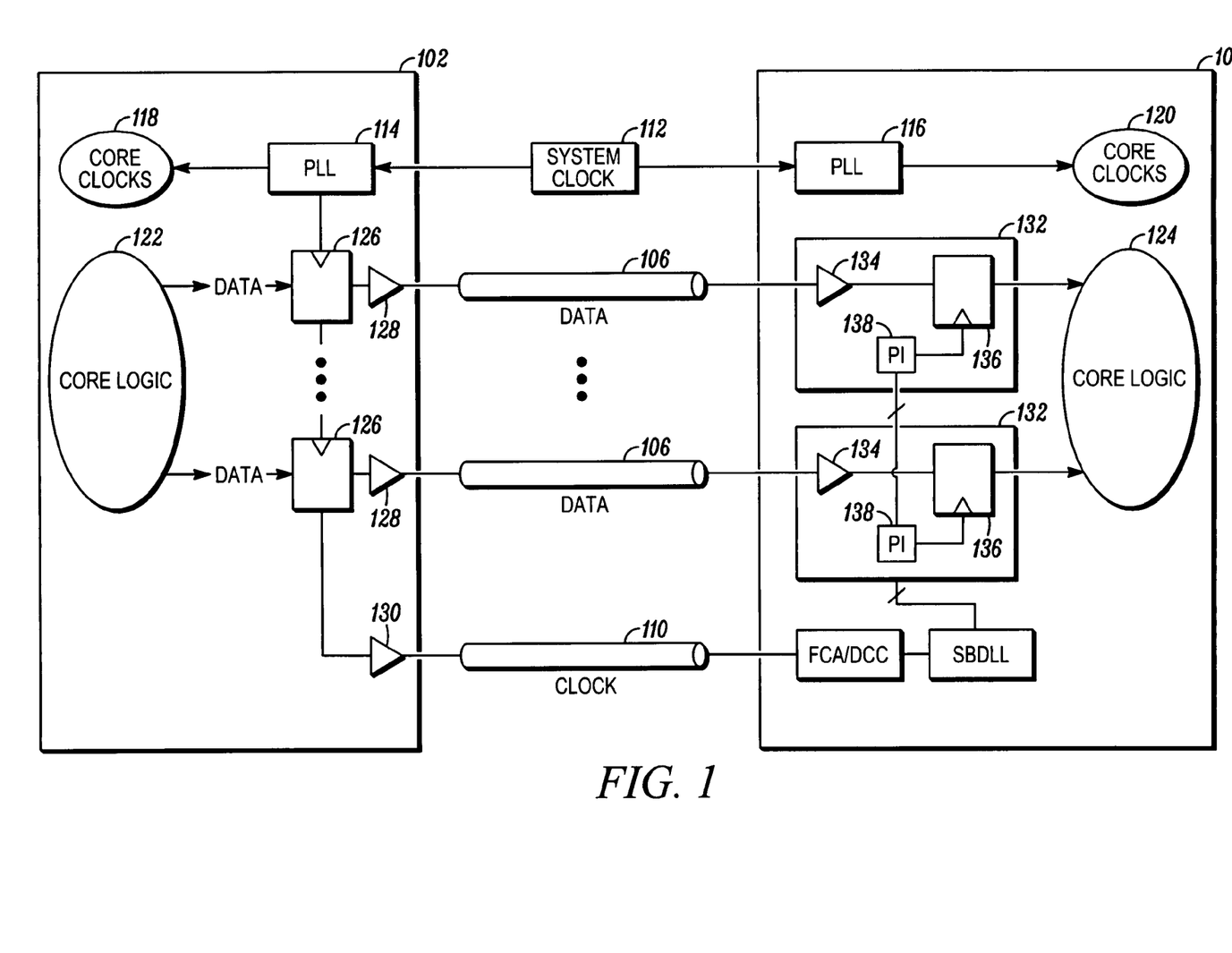
FIG. 1 illustrates a prior art source synchronous data communication system.

In a source synchronous data communication scheme for chip-to-chip communication, a clock signal for the data is transmitted along with the data. This may also be referred to as a forwarded clock scheme, and is illustrated at a high level of abstraction in FIG. 1. FIG. 1 illustrates the transfer of data signals and a clock signal from chip 102 to chip 104 via transmission lines 106 for the data signals, and transmission line 110 for the clock signal.

For simplicity, the data signals and clock signal are indicated as single-ended, but in other implementations, these signals may be differential signals. For example, a differential forwarded clock signal may be propagated, and the data signals may be differential. Some of these data signals may be error correction signals to provide error detection or error correction capability.

System clock 112 provides a clock signal to PLL (Phase Locked Loop) 114 on chip 102, and to PLL 116 on chip 104, so that a global clock may be generated for chips 102 and 104, as indicated by core clocks 118 and 120. Data signals are generated by core logic 122 on chip 102, and received data is made available to core logic 124 on chip 104. The data generated by core logic 122 is clocked into registers, or sets of flip-flops, 126, and the transmitters 128 transmit the data signals over transmission lines 106 to chip 104. Registers 126 are clocked by PLL 114, and PLL 114 also provides the forwarded clock signal to transmitter 130 for propagation over transmission line 110 to chip 104.

The data signals are received by data receivers 132. A typical data receiver 132 comprises amplifier 134 and register 136 for sampling the received data signal, and comprises PI (Phase Interpolator) 138 to provide a sampling clock signal to register 136. The forwarded clock signal is received and amplified by FCA/DCC (Forward Clock Amplifier/Duty Cycle Correction). The DCC functional unit is included in FCA/DCC because for differential signaling, the data is sampled on the rising and falling transitions of the differential forwarded signal, so that duty cycle correction should be performed to maintain a 50% duty cycle.

SBDLL (Self-Biased Delay Locked Loop) provides multiple clock signals at different relative phases, all generated from the amplified forwarded clock signal provided by FCA/DCC. For example, SBDLL may provide eight clock signals, each having a relative phase of $2\pi n/8$ radians, where n=0, 1, ..., 7. These multiple clock signals are provided to PI 138. Each PI 138 is adjusted via one or more control loops (not shown) to further interpolate among the multiple clock signals provided by SBDLL, with the goal of clocking their respective register 136 at the center of their respective data eye. For example, each PI 138 may provide a clock signal having any one of 64 phases. As a particular example, any two clock signals provided by SBDLL differing by $\pi/4$ radians may be interpolated so that any one of eight clock signals may be generated by PI 138, where the eight clock signals so generated are uniformly spaced in phase between the two selected clock signals from SBDLL. For differential signaling, the multiple clock signals provided by SBDLL are differential in nature.

Circuit blocks FCA/DCC and SBDLL, and receivers 132 in FIG. 1 are usually connected directly to a single power supply (not shown) providing a supply voltage $V_{CC}$. However, noise on the power supply rail $V_{CC}$ may produce phase jitter in the various generated clock signals, and may prevent the system from transmitting data at sufficiently high rates. Furthermore, SBDLL may output up to eight high speed clock signals, and in some applications, these eight high speed clock signals may be distributed to forty phase interpolators for 20 data lanes. It is difficult to match the clock routings due to layout errors, as well as systematic and random variations in the manufacturing process. As a result, the multiple clock signals generated by SBDLL may not have the uniformly spaced phase differences as desired. Also, distributing up to eight clock signals over several thousands of microns may generate noise in the power supply rail, thereby further contributing to phase jitter.

DESCRIPTION OF EMBODIMENTS

In the descriptions that follow, the scope of the term "some embodiments" is not to be so limited as to mean more than one embodiment, but rather, the scope may include one embodiment, more than one embodiment, or perhaps all embodiments.

Figure 2:
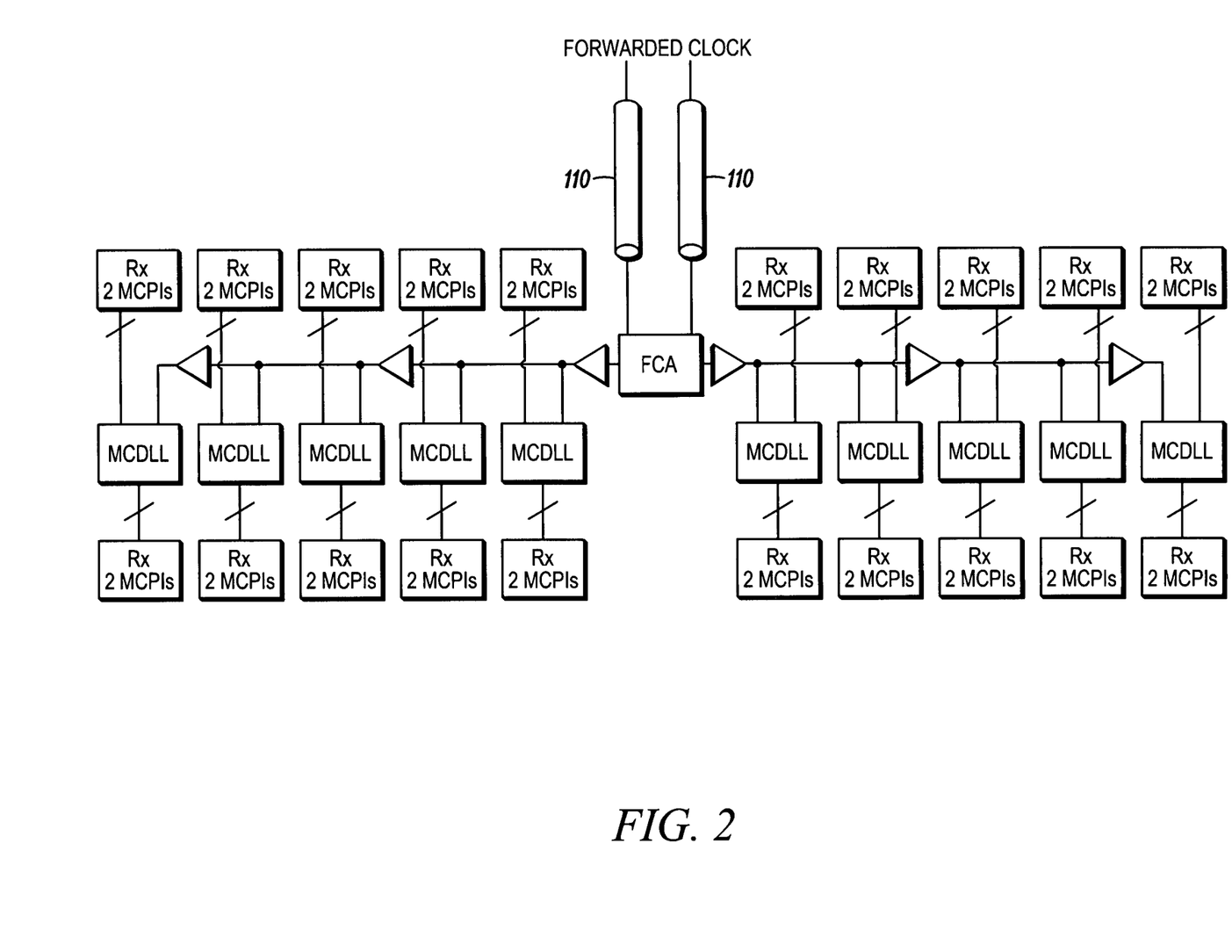
FIG. 2 illustrates a clock receiver architecture according to an embodiment of the present invention.

FIG. 2 illustrates at the architectural level an embodiment of the present invention. In the particular example of FIG. 2, differential signaling is employed. A forwarded clock signal propagated over transmission lines 110 is received and amplified by FCA (Forwarded Clock Amplifier). FCA provides the amplified forwarded clock signal to a set of delay locked loops. In the case of differential signaling, where the forwarded clock signal is differential in nature, FCA need only provide one-half of the received differential forwarded clock signal, so that the clock signal provided by FCA to the set of delay locked loops is single-ended.

In the particular embodiment of FIG. 2, the delay locked loops are matched-current delay locked loops, each denoted as MCDLL in FIG. 2. Each MCDLL provides a set of clock signals with uniformly spaced phases. For example, each MCDLL generates N clock signals, each having a relative phase of $2\pi n/N$ radians, where $n=0,1,\ldots,N-1$. That is, if $\phi(t)$ denotes a clock signal having a period T, then each MCDLL generates the N clock signals $\phi(t-nT/N)$ where $n=0,1,\ldots,N-1$. For some embodiments, $N=8$, so that the clock signals are uniformly spaced in phase space, where each two adjacent clock signals are separated in phase space by $\pi/4$ radians.

In the particular embodiment of FIG. 2, each MCDLL provides a set of clock signals to two receivers, where each receiver is denoted as Rx in FIG. 2. In other embodiments, each MCDLL may provide a set of clock signals to only one receiver, or to more than two receivers. In the particular example of FIG. 2, it is assumed that the data signals are differential. Furthermore, the data is assumed to be double pumped, so that two sampling clock signals are generated to sample the data on the rising edges of the sampling clock signals. Because the data is double pumped, each receiver Rx in the embodiment of FIG. 2 includes two matched-current phase interpolators.

More generally, circuit architectures includes a family of sets of phase interpolators in one-to-one correspondence with a set of delay locked loops, where each delay locked loop provides a set of clock signals to its corresponding set of phase interpolators. In the particular example of FIG. 2, the set of delay locked loops has ten delay locked loops, and the family of sets of phase interpolators has ten sets of phase interpolators, where each set of phase interpolators has four phase interpolators MCPI connected to its corresponding delay locked loop. (A set may include only one element, so that for some embodiments, a delay locked loop may provide clock signals to only one corresponding phase interpolator.)

Figure 10:
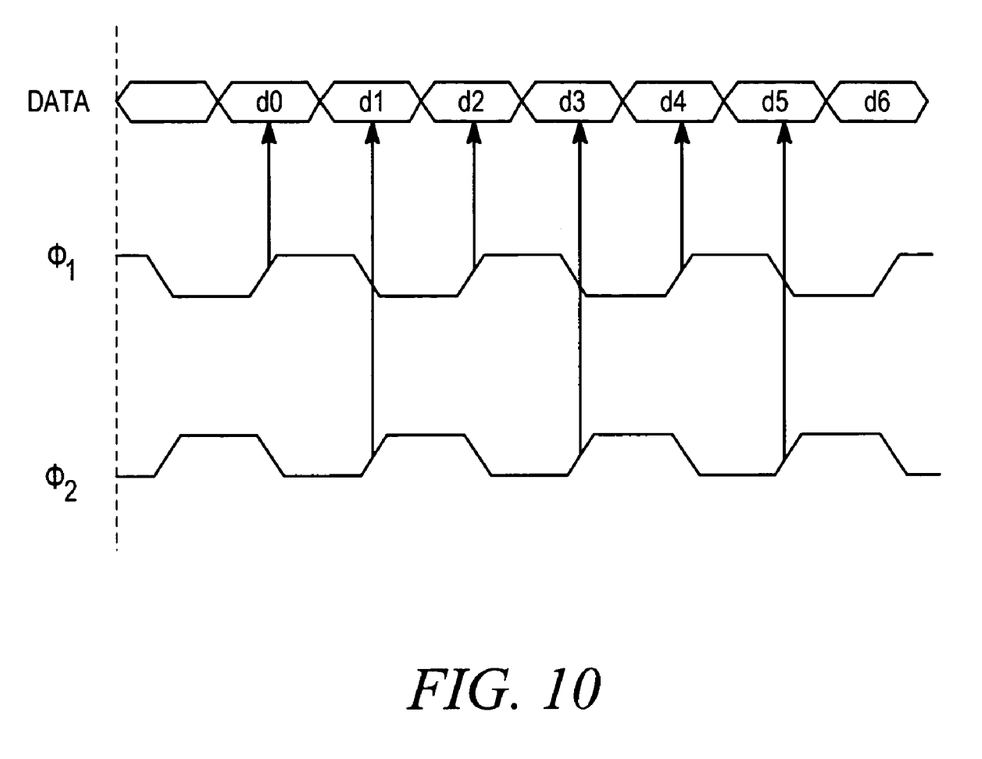
FIG. 10 illustrates sampling data on the rising edges of two clock signals according to an embodiment of the invention.

Each MCPI in FIG. 2 provides an interpolated clock signal to clock a register, so that the clocked register samples the received data signals at the data eye. For each receiver Rx, a first MCPI provides a first clock signal to its corresponding register to sample even-indexed data on the rising edge of the first clock signal, and a second MCPI provides a second clock signal to its corresponding register to sample odd-indexed data on the rising edge of the second clock signal. This is illustrated in FIG. 10, where the rising edges of clock signal $\Phi_1$ sample the even-indexed data, and the rising edges of clock signal $\Phi_2$ sample the odd-indexed data. Because only the rising edges of the clock signals are used to sample the data, it is not required that the duty cycle be 50%. As a result, a duty cycle correction circuit is not required, resulting in a saving of power.

In comparing the architecture of FIG. 2 with that of FIG. 1, it is seen that whereas SBDLL of FIG. 1 provides multiple clock signals over the layout of receivers 132, FCA of FIG. 2 need only provide one clock signal over the layout, and each individual MCDLL need only provide a set of clock signals over a relatively small portion of the layout. Because of this, matching of electrical lengths is made easier. In this way, it is expected that the design of FIG. 2 provides a set of clock signals having the desired spacing in phase, so as to help mitigate phase jitter. Although there are a multiple number of MCDLL in FIG. 2, as opposed to one SBDLL in FIG. 1, the power dissipation for each MCDLL may be designed to be much less than that of SBDLL, and the power dissipation for each MCPI may be designed to be less than PI 138, so that the architecture of FIG. 2 is expected to be power efficient when compared to the architecture of FIG. 1.

Circuit implementations for MCDLL and MCPI will be described later. It should be noted that the architecture of FIG. 2 is not limited to matched-current delay locked loops and matched-current phase interpolators, but other power efficient delay locked loops and phase interpolators may be employed.

Figure 3:
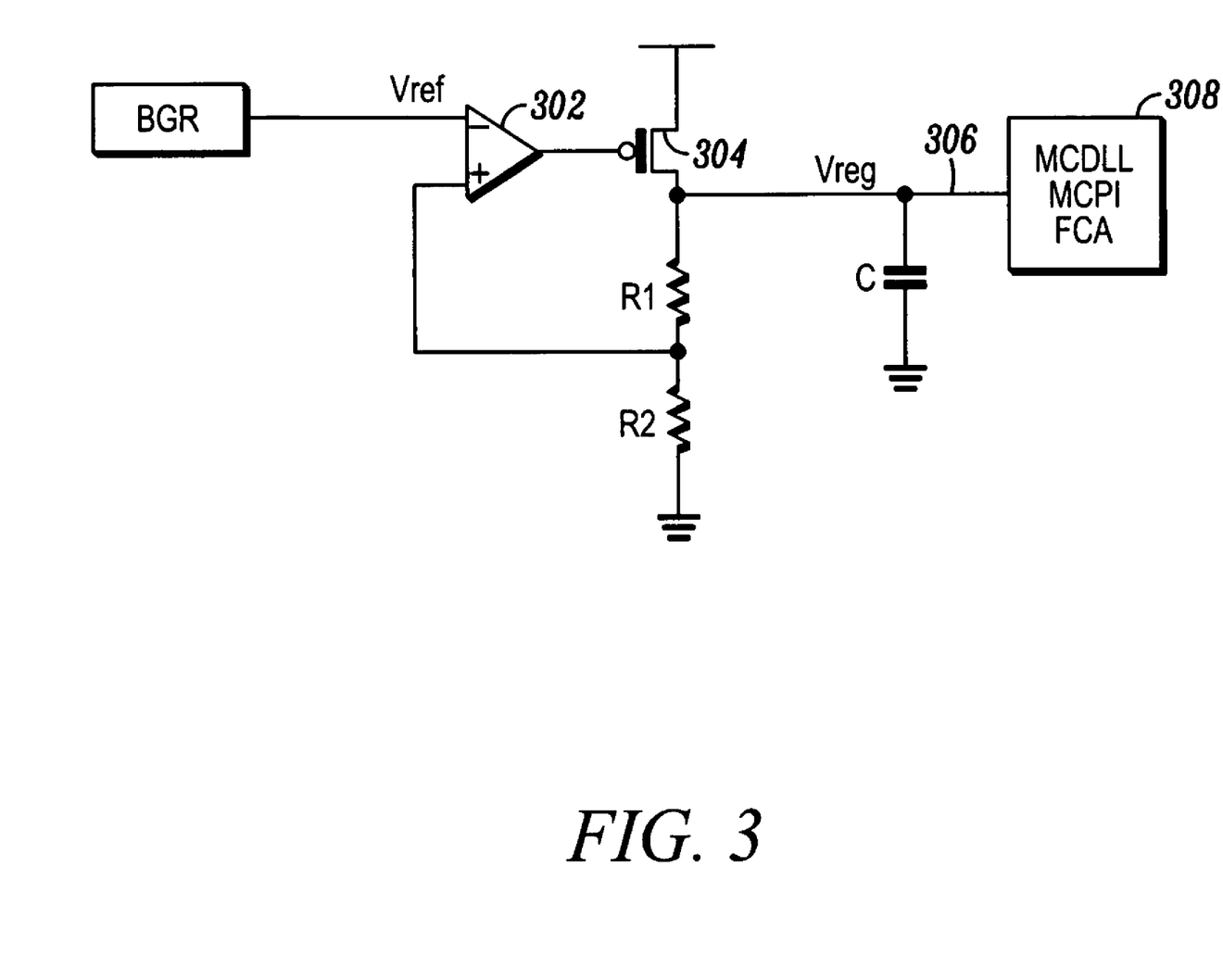
FIG. 3 illustrates an on-die voltage regulator for the embodiment of FIG. 2.

Another approach that is expected to help mitigate phase jitter is to utilize an on-die voltage regulator, illustrated in FIG. 3. BGR (Band Gap Reference) provides a voltage reference $V_{REF}$ to differential amplifier 302. With the negative feedback provided by pass transistor 304 and resistor R1, the regulated voltage, $V_{REG}$, provided at power rail 306, is $V_{REG}=V_{REF}(R1+R2)/R2$, where for convenience the symbols R1 and R2 do double duty so that R1 denotes the resistance of resistor R1, and R2 denotes the resistance of resistor R2. Functional block 308 represents the MCPI, MCDLL, and FCA circuits. Capacitor C should be large enough to provide a phase margin to ensure stability, and to provide a good power supply noise rejection ratio (PSRR).

Figure 4:
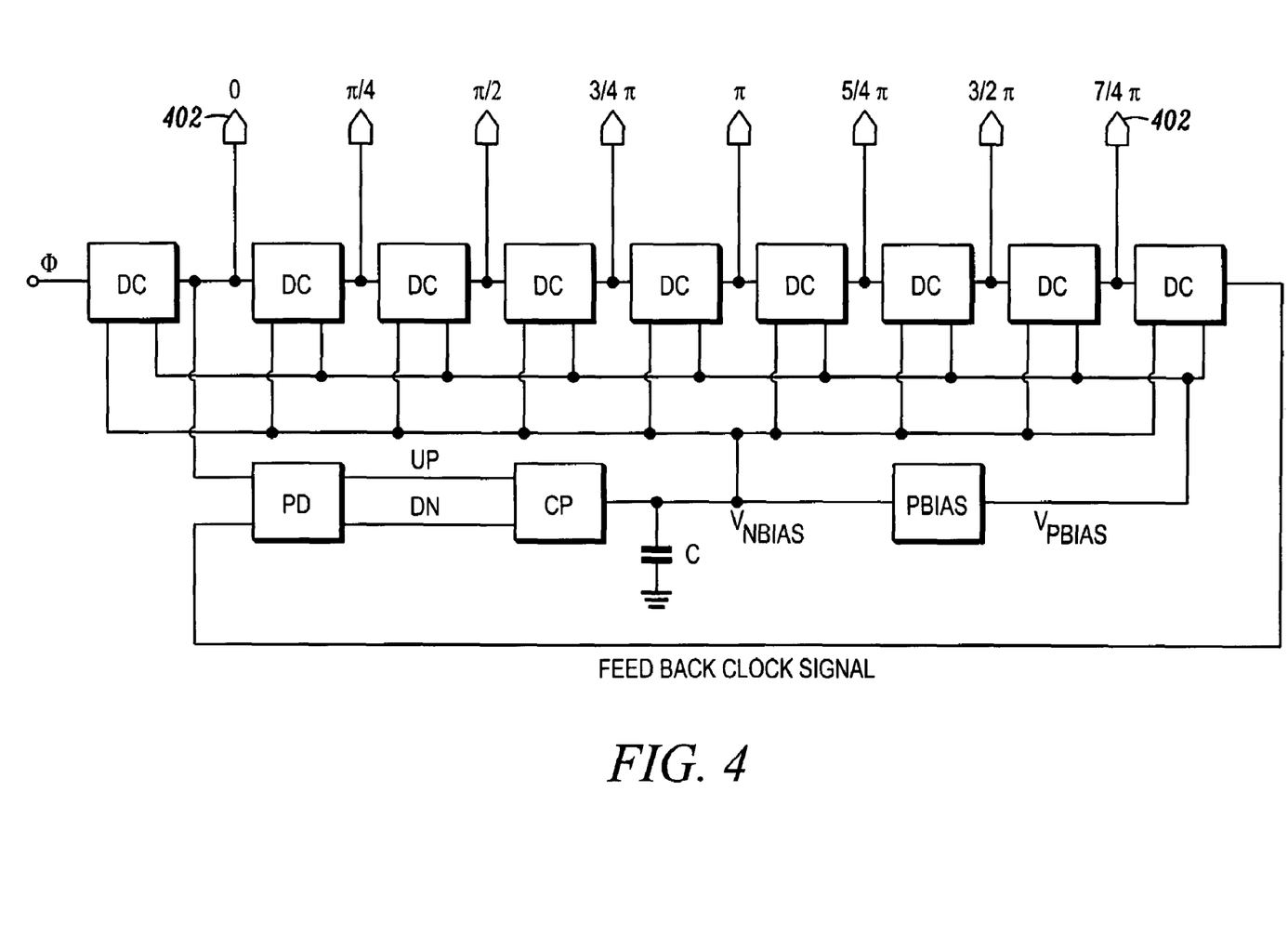
FIG. 4 illustrates a matched-current delay locked loop architecture according to an embodiment of the present invention.

FIG. 4 illustrates the architecture of an MCDLL according to an embodiment of the present invention. A reference clock signal, denoted as $\Phi$, is provided to the first delay cell DC in FIG. 4. The reference clock signal may be, for example, a received forwarded clock signal. In the particular embodiment of FIG. 4, there are nine delay cells DC altogether, and eight clock signals are provided at output ports 402. The relative phases of these eight clock signals are indicated in FIG. 4, where the phases range from 0 to $7\pi/4$ radians, with a phase difference between any two adjacent clock signals of $\pi/4$ radians.

The output port of the last delay cell DC provides a feedback clock signal to phase detector PD. The output of the first delay cell DC is also provided to phase detector PD. The feedback clock signal and the output signal provided by the first delay cell DC comprise the two input signals to phase detector PD. Phase detector PD provides a first signal, denoted as UP for "up", and a second signal, denoted as DN for "down", as a function of its two input signals. Various conventions may be followed in designing the relationship between the UP and DN signals and the two input signals to phase detector PD. For some embodiments, if feedback clock signal $\Phi_{FEEDBACK}$ lags reference clock signal $\Phi_{REF}$, then UP signal will have wider pulses than that of DN signal, and UP signal will having a rising transition preceding the rising transition of DN signal. Conversely, if feedback clock signal $\Phi_{FEEDBACK}$ leads reference clock signal $\Phi_{REF}$, then DN signal will have wider pulses than that of UP signal, and its upward transitions will precede that of UP signal. UP and DN signals are provided to charge pump CP so that charge is pumped into capacitor C during those time intervals for which UP signal has wider pulses than that of DN signal, and capacitor C is discharged during those time intervals for which DN signal has wider pulses than that of UP signal. (Capacitor C in FIG. 4 is not to be confused with capacitor C in FIG. 3.)

When capacitor C is charged, its voltage, denoted as bias voltage $V_{NBIAS}$, is raised, and when discharged, $V_{NBIAS}$ is lowered. Delay cells DC in FIG. 4 are designed such that increasing $V_{NBIAS}$ decreases their delay, and decreasing $V_{NBIAS}$ increases their delay. In this way, $V_{NBIAS}$ is controlled to align the phases of $\Phi_{REF}$ and $\Phi_{FEEDBACK}$. In steady state, these clock signals will align, so that lock is achieved.

Figure 5:
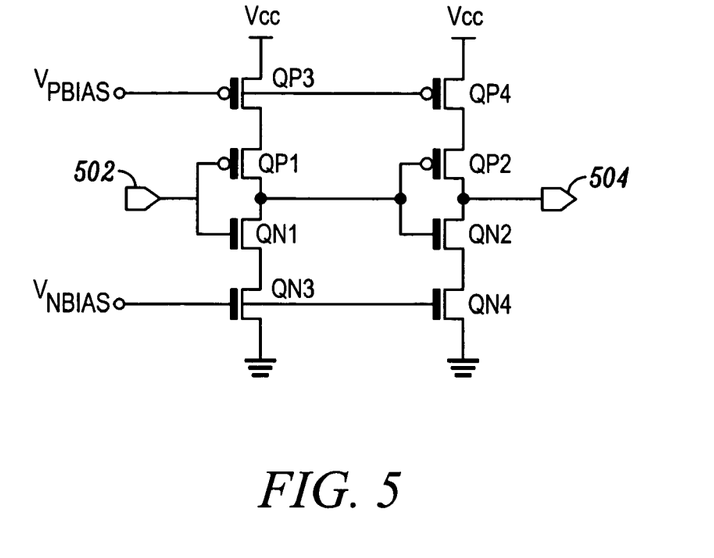
FIG. 5 illustrates a matched-current delay cell used in the embodiment of FIG. 4.

The delay cells DC in FIG. 4 are matched-current delay cells. A typical matched-current delay cell is illustrated in FIG. 5, comprising two inverters; one inverter comprising pMOSFET (p-Metal Oxide Semiconductor Field Effect Transistor) QP1 and nMOSFET QN1, and the other inverter comprising pMOSFET QP2 and nMOSFET QN2. Other embodiments may have less or more inverters for a matched-current delay cell. In the embodiment of FIG. 5, input port 502 is connected to the gates of transistors QP1 and QN1, and output port 504 is connected to the drains of transistors QP2 and QN2. pMOSFETs QP3 and QP4 have their gates biased at $V_{PBIAS}$, and nMOSFETs QN3 and QN4 have their gates biased at $V_{NBIAS}$. Transistors QP3 and QP4 are matched, transistors QP1 and QP2 are matched, transistors QN1 and QN2 are matched, and transistors QN3 and QN4 are matched. These matched transistors are matched to their corresponding transistors in the other matched-current delay cells.

Biasing adjusts the trip point of the inverters making up a matched-current delay cell, thereby adjusting the over-all delay. PBIAS in FIG. 4 comprises a feedback loop to adjust $V_{PBIAS}$ so that the pull-up and pull-down currents in a matched-current delay cell are matched across process, supply voltage, and temperature (PVT) variations. As a result, good mitigation against phase jitter is expected, so that the matched-current delay locked loop provides multiple clock signals having equally spaced phases.

Figure 6:
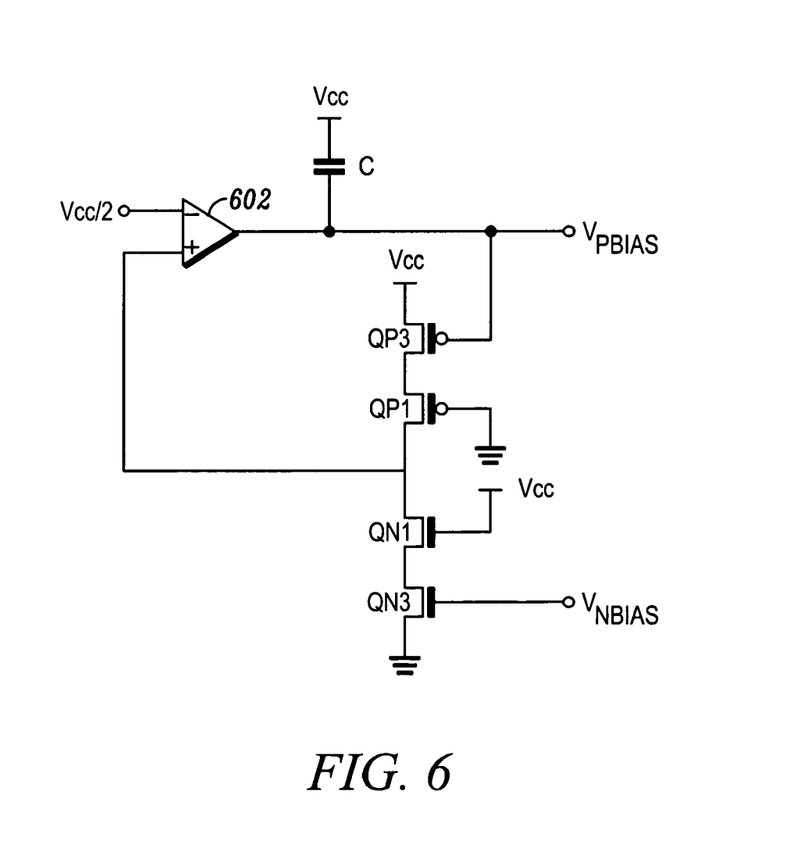
FIG. 6 illustrates a bias circuit used in the embodiment of FIG. 4 to provide a bias voltage.

An embodiment of PBIAS is illustrated in FIG. 6. Denoting the supply voltage as $V_{CC}$, the negative input port of differential amplifier 602 is held at one-half of the supply voltage, $V_{CC}/2$, and the positive input port of differential amplifier 602 is connected to the drains of transistors QP1 and QN1 in FIG. 6. (Transistors QP1, QN1, QP3, and QN3 in FIG. 6 are not to be confused with the transistors in FIG. 5.) The gate of transistor QN3 is biased at $V_{NBIAS}$. The output port of differential amplifier 602 is connected to the gate of transistor QP3.

The output port of differential amplifier 602 provides the bias voltage $V_{PBIAS}$. Transistor QP1 of FIG. 6 is matched to transistor QP1 of FIG. 5, and transistor QN1 of FIG. 6 is matched to transistor QN1 of FIG. 5. Similarly, transistor QP3 of FIG. 6 is matched to transistor QP3 of FIG. 5, and transistor QN3 of FIG. 6 is matched to transistor QN3 of FIG. 5. Note that the gate of transistor QP1 is held at ground (substrate voltage $V_{SS}$), and the gate of transistor QN1 is held at $V_{CC}$, so that a non-zero static current is flowing through the transistors in FIG. 6. Because the feedback loop in FIG. 6 forces the drains of transistors QP1 and QN1 at $V_{CC}/2$, and because of the matching of the transistors in the circuit of FIG. 6 to their corresponding transistors in the matched-current delay cells, the bias voltage $V_{PBIAS}$ generated by the circuit of FIG. 6 biases the various pMOSFETs in the matched-current delay cells so that pull-up and pull-down currents are matched across process, supply voltage, and temperature variations.

Capacitor C in FIG. 6 couples the output port of differential amplifier 602 to the supply rail $V_{CC}$, so that bias voltage $V_{PBIAS}$ follows fluctuations in the supply voltage $V_{CC}$. This further helps isolates power supply noise so that phase jitter performance is improved.

Figure 7:
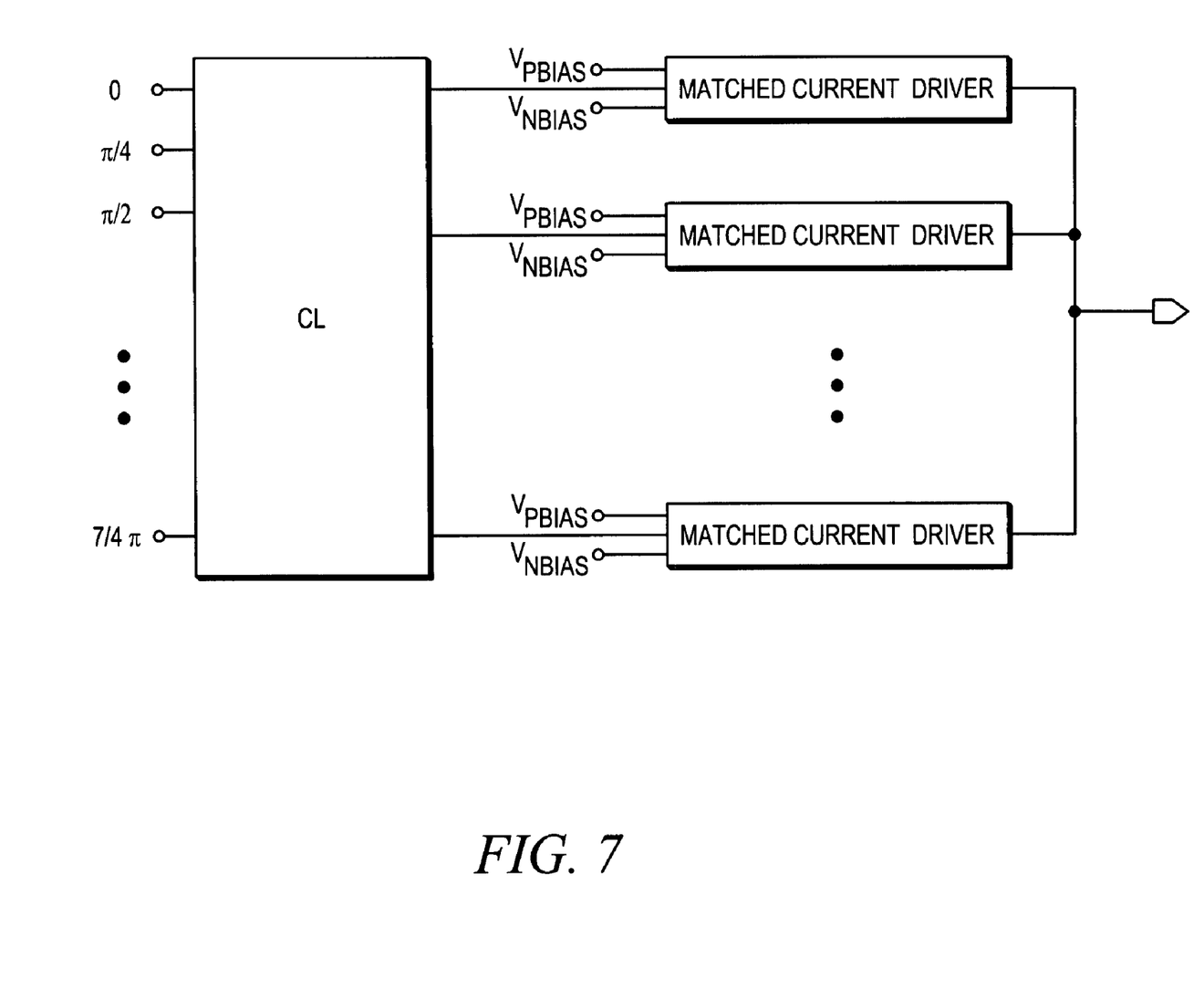
FIG. 7 illustrates a matched-current phase interpolator used in the embodiment of FIG. 4.

An embodiment of a matched-current phase interpolator is illustrated in FIG. 7. In the particular embodiment of FIG. 7, eight clock signals are available to combinational logic CL, where the relative phases of the eight clock signals are indicated in FIG. 7. The circuit of FIG. 7 comprises eight matched-current drivers, each one having an input port connected to combinational logic CL, and each one biased by the bias voltages $V_{NBIAS}$ and $V_{PBIAS}$. Combinational logic CL provides to the input ports of each matched-current driver one of two selected adjacent clock signals.

For example, if it is desired to generate a clock signal having a relative phase $\theta$ in the range $(n-1)\pi/4 \leq \theta \leq n\pi/4$ for some index n in the range [0,8], then the two clock signals with relative phases $(n-1)\pi/4$ and $n\pi/4$ are selected as possible input clock signals to the matched-current drivers. The eight matched-current drivers provide a finer graduation of $\pi/32$ phase shifts, so for the example in which the relative phase of the interpolated clock signal is desired to be in the range $(n-1)\pi/4 \leq \theta \leq n\pi/4$, the matched-current phase interpolator provides an interpolated clock signal having any one of the relative phases $(n-1)\pi/4 + m\pi/32$, where $m=0, \ldots, 8$.

Continuing with the above example, if it is desired that the interpolated clock signal has a relative phase of $(n-1)\pi/4 + m\pi/32$, then combinational logic CL provides to exactly m matched-current drivers the clock signal having the relative phase $n\pi/4$, and provides to exactly 8–m matched-current drivers the clock signal having the relative phase of $(n-1)\pi/4$.

Figure 8:
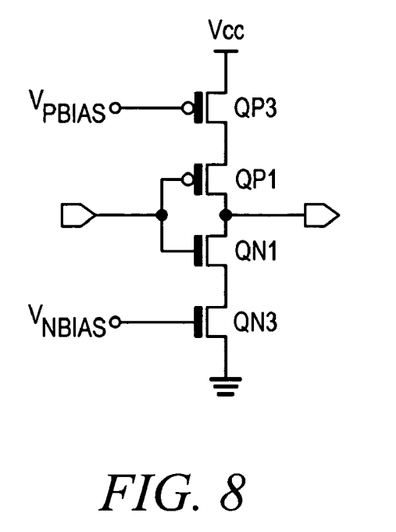
FIG. 8 illustrates a matched-current driver circuit used in the embodiment of FIG. 7.

The output ports of the matched-current drivers are hardwired together as indicated in the embodiment of FIG. 7. An embodiment of a matched-current driver is illustrated in FIG. 8, comprising transistors QN1, QP1, QP3, and QN3 (not to be confused with the similarly labeled transistors in the previous figures). The gates of transistors QP1 and QN1 comprise the input port to the matched-current driver, and their drains comprise the output port. The gate of transistor QP3 is biased at $V_{PBIAS}$, and the gate of transistor QN3 is biased at $V_{NBIAS}$. Transistor QN1 of FIG. 8 is matched to transistor QN1 of FIG. 6. Similar statements apply to the other transistors. Because of this matching and the way in which $V_{PBIAS}$ is generated, pull-up currents are matched to pull-down currents across process, supply voltage, and temperature variations. As a result, it is expected that employing matched-current delay locked loops and matched-current phase interpolators result in good reduction of phase jitter.

Note that the matched-current delay locked loops and the matched-current phase interpolators have little static current because many of the sub-circuit elements making up these circuits are essentially CMOS-like (Complementary Metal Oxide Semiconductor) inverters, except that transistors QP1, QN1, QP3, and QN3 in the PBIAS circuit of FIG. 6 consume static current. Consequently, it is expected for the architecture of FIG. 2 that embodiments may be realized in which the matched-current delay locked loops consume less power than a self-biased delay locked loop.

Embodiments are expected to find wide application in chip-to-chip communications. One particular application is in a computer system to facilitate point-to-point communication from one chip to another, such as for example in an upcoming Intel® communication protocol, referred to by Intel as the Common System Interface. Intel is a registered trademark of Intel Corporation, a Delaware Corporation with headquarters at 2200 Mission College Blvd., Santa Clara, Calif. However, embodiments of the present invention are not limited to Intel products or designs.

Figure 9:
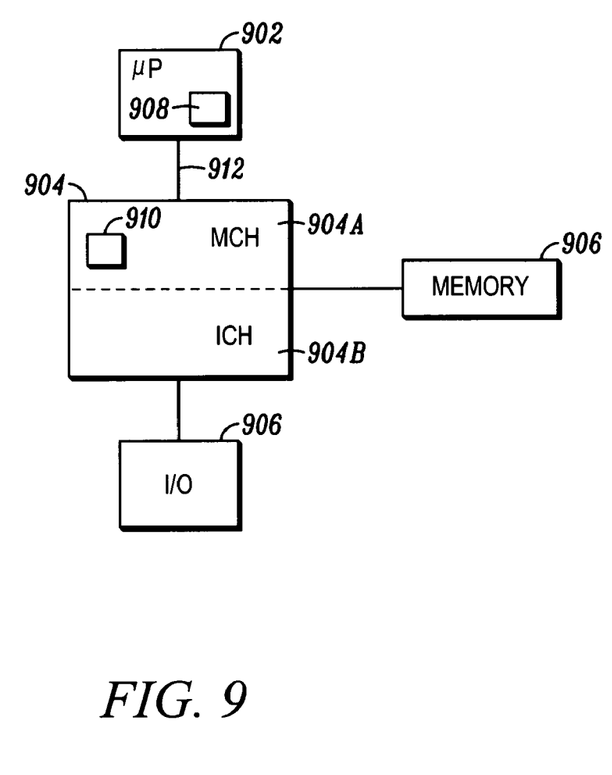
FIG. 9 illustrates a computer system employing embodiments of the present invention.

FIG. 9 illustrates, in simplified form, a portion of a computer system employing an embodiment of the present invention. The computer system comprises microprocessor die 902, chipset 904, and system memory 906. In the particular embodiment of FIG. 9, chipset 904 includes MCH (Memory Controller Hub) 904A and ICH (Input/Output Controller Hub) 904B. MCH 904A provides communication to system memory 906, and ICH 904B provides communication to input/output devices, collectively indicated by functional block I/O 906. Some or all of the functions provided by chipset 904 may reside on one or more distinct chips (dice), or may be integrated on microprocessor die 902. An embodiment of the present invention may be integrated on microprocessor die 904, indicated by functional block 908, and another embodiment may be integrated on chipset 904, indicated by functional block 910. These two embodiments communicate data and one or more forwarded clock signals by way of transmission lines 912.

Various modifications may be made to the disclosed embodiments without departing from the scope of the invention as claimed below. For example, for some embodiments, delay locked loops other than matched-current delay locked loops, and phase interpolators other than matched-current phase interpolators, may be employed in the architecture of FIG. 2.

It is to be understood in these letters patent that the meaning of "A is connected to B", where A or B may be, for example, a node or device terminal, is that A and B are connected to each other so that the voltage potentials of A and B are substantially equal to each other. For example, A and B may be connected together by an interconnect (transmission line). In integrated circuit technology, the interconnect may be exceedingly short, comparable to the device dimension itself. For example, the gates of two transistors may be connected together by polysilicon, or copper interconnect, where the length of the polysilicon, or copper interconnect, is comparable to the gate lengths. As another example, A and B may be connected to each other by a switch, such as a transmission gate, so that their respective voltage potentials are substantially equal to each other when the switch is ON.

It is also to be understood in these letters patent that the meaning of "A is coupled to B" is that either A and B are connected to each other as described above, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

It is also to be understood in these letters patent that various circuit blocks, such as current mirrors, amplifiers, etc., may include switches so as to be switched in or out of a larger circuit, and yet such circuit blocks may still be considered connected to the larger circuit because the various switches may be considered as included in the circuit block.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A circuit comprising:
    a forwarded clock amplifier;
    a set of delay locked loops coupled to the forwarded clock amplifier; and
    a family of sets of phase interpolators in one-to-one correspondence with the set of delay locked loops, each delay locked loop to provide a set of clock signals to a corresponding set of phase interpolators;
    each delay locked loop comprising:
        a set of delay cells, where each delay cell comprises:
            a pull-up pMOSFET biased at a bias voltage $V_{PBIAS}$;
            a pull-down nMOSFET biased at a bias voltage $V_{NBIAS}$;
            a pMOSFET comprising a drain and a source connected to the pull-up pMOSFET; and
            an nMOSFET comprising a drain connected to the drain of the pMOSFET, and a source connected to the pull-down nMOSFET;
        a charge pump to provide the bias voltage $V_{NBIAS}$; and
        a bias circuit to provide the bias voltage $V_{PBIAS}$, the bias circuit comprising
            a differential amplifier comprising a negative input port, a positive input port, and an output port;
            a pull-up pMOSFET comprising a gate connected to the output port of the differential amplifier, and a drain;
            a pMOSFET comprising a gate, and a source connected to the drain of the pull-up pMOSFET, and a drain connected to the positive input port of the differential amplifier;
            an nMOSFET comprising a gate, a drain connected to the positive input port of the differential amplifier, and a source; and
            a pull-down nMOSFET comprising a gate, a drain connected to the source of the nMOSFET, and a source;
        wherein the output port of the differential amplifier provides the bias voltage $V_{PBIAS}$ provided the gate of the pMOSFET of the bias circuit is held at a ground voltage, the gate of the nMOSFET of the bias circuit is held at a supply voltage $V_{CC}$, the gate of the pull-down nMOSFET of the bias circuit is held at the bias voltage $V_{NBIAS}$, and the negative input port of the differential amplifier is held at the voltage $V_{CC}/2$.

2. The circuit as set forth in claim 1, wherein the pull-up pMOSFETs for the bias circuits and the pull-up pMOSFETs for the delay cells are matched to each other, the pull-down nMOSFETs for the bias circuits and the pull-down nMOSFETs for the delay cells are matched to each other, the pMOSFETs for the bias circuits and the pMOSFETs for the delay cells are matched to each other, and the nMOSFETs for the bias circuits and the nMOSFETs for the delay cells are matched to each other.

3. A circuit comprising:
    a forwarded clock amplifier having an output port;
    first and second delay locked loops connected to the forwarded clock amplifier;
    a first phase interpolator connected to the first delay locked loop; and
    a second phase interpolator connected to the second delay locked loop; each delay locked loop comprising:
    a set of delay cells, where each delay cell comprises:
        a pull-up pMOSFET biased at a bias voltage $V_{PBIAS}$;
        a pull-down nMOSFET biased at a bias voltage $V_{NBIAS}$;
        a pMOSFET comprising a drain and a source connected to the pull-up pMOSFET; and
        an nMOSFET comprising a drain connected to the drain of the pMOSFET, and a source connected to the pull-down nMOSFET;
    a charge pump to provide the bias voltage $V_{NBIAS}$; and
    a bias circuit to provide the bias voltage $V_{PBIAS}$, the bias circuit comprising
        a differential amplifier comprising a negative input port, a positive input port, and an output port;
        a pull-up pMOSFET comprising a gate connected to the output port of the differential amplifier, and a drain;

a pMOSFET comprising a gate, and a source connected to the drain of the pull-up pMOSFET, and a drain connected to the positive input port of the differential amplifier;

an nMOSFET comprising a gate, a drain connected to the positive input port of the differential amplifier, and a source; and a pull-down nMOSFET comprising a gate, a drain connected to the source of the nMOSFET, and a source;

wherein the output port of the differential amplifier provides the bias voltage $V_{PBIAS}$ provided the gate of the pMOSFET of the bias circuit is held at a ground voltage, the gate of the nMOSFET of the bias circuit is held at a supply voltage $V_{CC}$, the gate of the pull-down nMOSFET of the bias circuit is held at the bias voltage $V_{NBIAS}$, and the negative input port of the differential amplifier is held at the voltage $V_{CC}/2$.

4. The circuit as set forth in claim 3, wherein the pull-up pMOSFETs for the bias circuits and the pull-up pMOSFETs for the delay cells are matched to each other, the pull-down nMOSFETs for the bias circuits and the pull-down nMOSFETs for the delay cells are matched to each other, the pMOSFETs for the bias circuits and the pMOSFETs for the delay cells are matched to each other, and the nMOSFETs for the bias circuits and the nMOSFETs for the delay cells are matched to each other.

5. The circuit as set forth in claim 4, each phase interpolator comprising a set of matched-current drivers, each matched-current driver comprising a pull-up pMOSFET biased by the bias voltage $V_{PBIAS}$ and matched to the pull-up pMOSFETs for the delay cells;

a pMOSFET matched to the pMOSFETs for the delay cells;

an nMOSFET matched to the nMOSFETs for the delay cells; and a pull-down nMOSFET biased by the bias voltage VNBIAS and matched to the pull-down nMOSFETs for the delay cells.

* * * * *